United States Patent [19]
Shibib

[11] Patent Number: 5,534,721
[45] Date of Patent: Jul. 9, 1996

[54] AREA-EFFICIENT LAYOUT FOR HIGH VOLTAGE LATERAL DEVICES

[75] Inventor: Muhammed A. Shibib, Wyomissing Hills, Pa.

[73] Assignee: AT&T Corp., Murray Hill, N.J.

[21] Appl. No.: 346,706

[22] Filed: Nov. 30, 1994

[51] Int. Cl.$^6$ .................................................. H01L 29/76
[52] U.S. Cl. ........................ 257/339; 257/343; 257/409; 257/493
[58] Field of Search ...................................... 257/343, 341, 257/342, 335, 339, 409, 491, 492, 493

[56] References Cited

U.S. PATENT DOCUMENTS 5,304,827  4/1994  Malhi et al. .............................. 257/339

OTHER PUBLICATIONS

J. A. Appels and H. M. J. Vaes, "High–Voltage Thin Layer Devices (RESURF Devices)," *Technical Digest, 1979, International Electronic Devices Meeting*, pp. 238–241.
K. Board and M. Darwish, "LDMOS Transistors with Implanted and Deposited Surface Layers," *IEE Proceedings–I*, Aug. 1985, pp. 177–180.
S. Colak, "Effects of Drift Region Parameters on the Static Properties of Power LDMOST," *Transactions IEEE Electronic Devices*, vol. ED–28, No. 12, Dec. 1981, pp. 1455–1466.
E. J. Wildi, P. V. Gray, T. P. Chow, H. R. Chang, and M. E. Cornell, "Modeling and Process Implementation of Implanted RESURF Type Devices," *Technical Digest, 1979, International Electronic Devices Meeting*, pp. 238–241.
H. Yilmaz, "Modeling nd Optimization of Lateral High Voltage IC Devices to Minimize 3–D Effects," *Electrochemical Society Proceedings on High Voltage and Smart Power Devices*, vol. 87–13, 1987, pp. 290–294.

*Primary Examiner*—Rolf Hille
*Assistant Examiner*—Minhloan Tran

[57] ABSTRACT

A lateral semiconductor device is disclosed having a semiconductor body of a first conductivity type, and a drift region having a second conductivity type opposite that of the first conductivity type and formed on a surface of the semiconductor body. A drain region formed in the drift region includes an end portion having a surface area including a predetermined surface radius of curvature and a first surface width; a transitional portion tapers from the first surface width to a second surface width; and a medial portion having the second surface width. A source region is formed in the drift region and spaced from the drain region.

19 Claims, 3 Drawing Sheets

AREA-EFFICIENT LAYOUT FOR HIGH VOLTAGE LATERAL DEVICES

BACKGROUND OF THE INVENTION

1. Field of the Invention

This invention relates to lateral semiconductor devices, and more particularly to high voltage lateral devices with a reduced area configuration.

2. Description of the Related Art

High voltage lateral devices using very thin epitaxial or implanted layers are widely known. In these lateral devices, changes in the electric field distribution take place near the surface. RESURF (REduced SURface Field) technology has been developed to fabricate these devices. The basic structure generally consists of a high-ohmic P-type semiconductor substrate with a lightly-doped formed using this technique.

The critical characteristics for a high voltage lateral device include the breakdown voltage, the on-state resistance, and the overall area of the device. Optimization of those characteristics requires attention to design parameters, particularly doping concentrations, drift length or lateral separation between drain/high-voltage regions and source/low-voltage regions, and the shaping or radius of curvature of the $N^+$ and $P^+$ regions.

High voltage lateral devices are normally required to handle more than 300 volts. Conventional 2-dimensional analysis considers the necessary substrate doping and drift length to achieve the breakdown voltage for a particular device. Frequently, these lateral devices are formed with elongated $N^+$ drain regions or source regions which terminate with a predetermined planform radius of curvature at the surface. However, the 3-dimensional effect of this curvature of the $N^+$ drain region on the electric field is often not considered in 2-dimensional analysis, yet this curvature may be a limiting factor for the breakdown voltage of the device, according to H. Yilmaz in "Modeling and Optimization of Lateral High Voltage IC Devices to Minimize 3-D Effects," *Electrochemical Society Proceedings on High Voltage and Smart Power Devices*, Vol. 87-13. The curvature of the $N^+$ drain/collector electrode enhances the electric field at the $N-N^+$ junction. Therefore, actual breakdown voltage of lateral devices optimized by 2-dimensional simulation will be reduced by the $N-N^+$ junction curvature. According to E. J. Wildi et al. in "Modeling and Process implementation of implanted RESURF Devices," *Technical Digest* 1982 *IEDM*, pp. 268–271, breakdown occurs first in a test device at the tip of an $N^+$ region having a smaller radius of curvature than elsewhere in the device. The 3-D charge control model of Yilmaz suggests that curvature effects may be reduced with a consequent increase in breakdown voltage by either (1) increasing the $N^+$ drain radius of curvature, or (2) increasing the drift length between the $N^+$ drain and the source at the ends of the $N-N^+$ junction where the curvature exists. The first method, increasing the $N^+$ radius, has the effect of increasing the width of the body of the entire $N^+$ drain region, as well as the overall area of the device if the optimum drift lengths are maintained around the widened $N^+$ drain. The second method, i.e. maintaining the optimized drift length throughout the device while increasing drift length at the ends, is disadvantageous because the lengthened drift regions may significantly increase the on-state resistance of the device.

Therefore, there is a need for a high voltage lateral device that utilizes less area, yet maintains the breakdown voltage and on-state resistance of the device.

SUMMARY OF THE INVENTION

A lateral semiconductor device is disclosed to displace a minimum surface area. The device includes a semiconductor body of a first conductivity type. A drift region having a second conductivity type opposite that of the first conductivity type is formed on a surface of the semiconductor body. A drain region formed in the drift region has a surface area including an end portion with a predetermined surface radius curvature and a first lateral width. The drain region also includes a transitional portion wherein the planform width tapers from the first width to a second lateral width, and a medial portion having the second width. A source region is formed in the drift region and spaced from the drain region.

The predetermined planform radius of curvature of the drain region may be selected such that the drain region will sustain a predetermined minimum breakdown voltage of the device. The source region may be uniformly spaced from the drain region to maximize the active region of the device.

BRIEF DESCRIPTION OF THE DRAWINGS

So that one skilled in the art to which the subject invention appertains will better understand how to practice the present invention, a preferred embodiment of the apparatus will be described in detail hereinbelow with reference to the drawings wherein.

DETAILED DESCRIPTION OF THE PREFERRED EMBODIMENT

The drawings and the specifications which follow are directed to a lateral double-diffused insulated gate field effect transistor (also referred to as LDMOS transistors). Nevertheless, the layout of the device is applicable to lateral diodes, thyristors, IGFET and MOS transistors. The terms "source" and "drain" are used to describe the regions in the preferred embodiments described below. However, the descriptions that apply to the "source" apply to a "cathode" or "emitter". Likewise, descriptions referring to the "drain" are applicable to an "anode" or "collector", depending upon the application.

Figure 1:
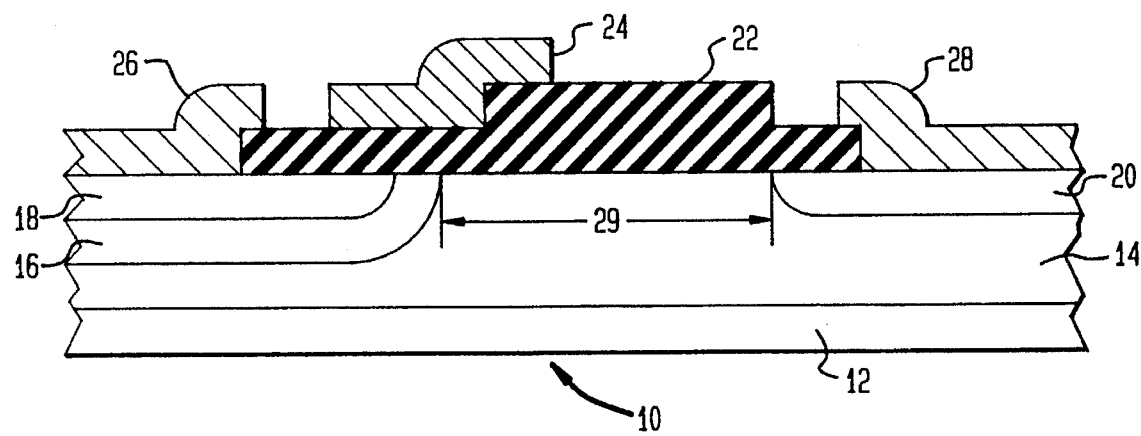
FIG. 1 is a cross-sectional view of the lateral semiconductor device.

Referring to FIG. 1, an LDMOS transistor is indicated generally at 10. A P-type semiconductor substrate is indicated at 12. A lightly doped N-type drift region 14 may be an epitaxial layer overlaying the substrate 12. Alternatively, the drift region 14 could be implanted with the desired dose directly into the starting substrate 12.

A gate oxide layer 22 is grown on the surface of the semiconductor 10 in an oxygen or oxygen/steam atmosphere. Subsequently, a layer of polycrystalline silicon (poly) is deposited on the surface of the semiconductor wafer, patterned and etched to form conductive poly gate 24. A layer of oxide or photoresist may be used as a mask for two implants of different conductivity types. First, a P type dopant such as boron is implanted into area 14 to create P region 16. Using the same mask or a similar one, a second implant is performed, in this case an N type dopant is employed, such as phosphorus or arsenic. This creates an N type region 18 that is shallower than the P region 16. The P region 16 will have a dopant concentration which is higher than the background dopant concentration of the P-semiconductor layer 12. The P and N implants are driven in via a diffusion step to produce an insulated gate field effect transistor (IGFET) having a P-type body 16 surrounding N type source region 18. The top of the body 16 will serve as a channel region of a field effect transistor to be fabricated between source region or cathode 18 and drift region 14. An $N^+$ drain implant is performed, for example, with phosphorus, followed by a drive-in diffusion step. This could be the same step as for source 18. This implant creates the drain region or anode 20 which may have the dopant concentration of source region 18. Alternatively, the anode region may be $P^+$ type. Poly gate 24 extends from a point near the lateral margin of the source region 18, over the channel body 16 and over a portion of the drift region 14. The drift length 29 is generally described as the distance between the body 16 and the drain region 20.

To complete the device, a layer of dielectric material, such as borophosphosilicate glass (BPSG) may be deposited, as well as a contact photoresist layer. Appropriate contacts are etched to expose at least portions of source region 18, and drain region 20. The metallization is applied using aluminum to fabricate contacts 26 and 28.

Figure 2:
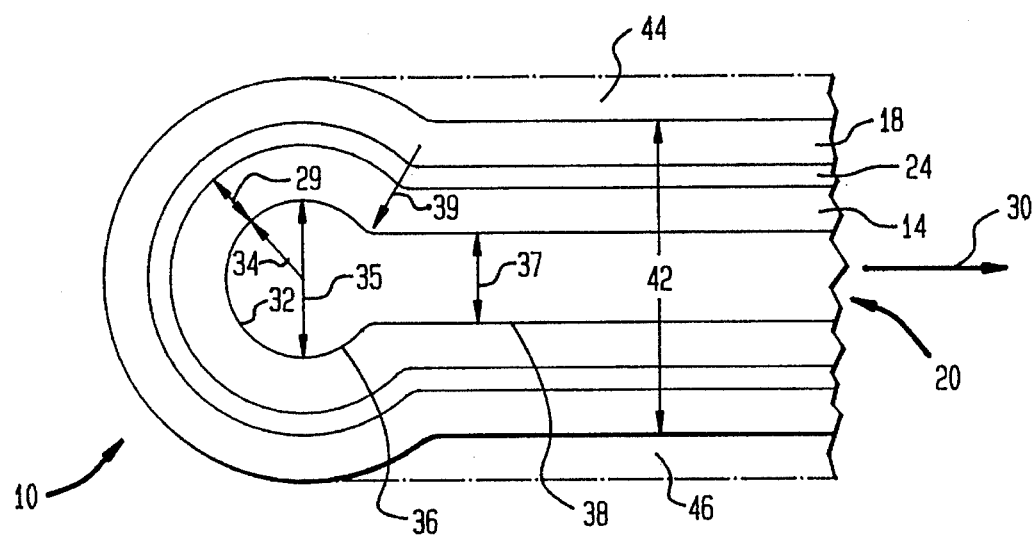
FIG. 2 is a top view of the lateral semiconductor device.

FIG. 2 is a top view of the LDMOS transistor indicated generally at 10. The LDMOS transistor 10 may take any of several forms. The indicated structure may be elongated indefinitely in parallel to direction 30 to create a series of elongate structures, as current carrying characteristics require. The LDMOS transistor structure may be repeated as many times as desired. With multiple sources and drains, drain region 20 would alternate with source region 18.

Silicon has a breakdown voltage characteristic of approximately $3.0 \times 10^5$ volts per cm, at which point carriers are generated, which collide with the crystal lattice to "free" an electron-hole pair. The electric field provides the kinetic energy to accelerate free carriers to participate in additional carrier creating collisions. Therefore, the specification of the lateral drift region 14 between source 20 and drain is an important design consideration. For a predetermined doping concentration, a longer drift length 29 is necessary for a device requiring a higher breakdown voltage. The ends 32 of the $N^+$ drain region 20 will have an electric field markedly exceeding that of the rest of the device. This results from the steep potential gradient extending from a high voltage drain region 20 having a right angle corner or a small radius of curvature to a lower voltage drift region 14 and source 18. Since the field at an end portion 32 may exceed the critical field strength of $3.0 \times 10^5$ volts per cm, the end configuration becomes critical to the breakdown voltage of the entire device.

A surface layout for the LDMOS transistor 10 is disclosed wherein the $N^+$ drain region 20 is provided with a minimum planform radius of curvature 34 approximately describing a semicircle or arc portion at an end portion 32 thereof. The minimum radius of curvature 34 should be sufficiently large in order to maintain a high breakdown voltage for the device 10. For high voltage lateral devices, a desirable minimum breakdown voltage would be 400 volts. The end portion 32 would also describe a first, maximum width 35. In a transitional portion 36, the lateral width of the drain region 20 is gradually tapered from the first maximum width 35 to a second minimum width 37. A medial portion 38 of the drain 20 maintains the second minimum lateral width. The curvature 39 of the transitional portion 36 may be determined experimentally, but the radius of curvature should remain larger than the minimum radius of curvature 34 of the end portion 32.

The length 29 of the drift region 14 may be determined using analysis methods as described by S. Colak in "Effects of Drift Region Parameters on the Static Properties of Power LDMOST," *Trans. IEEE Electron Devices*, Vol. ED-28, No. 12, December 1981, pp. 1455–1466. According to Colak's use of numerical modeling, reducing the thickness of the drift region 14 up to a point improves breakdown voltage characteristics by creating a more uniform potential gradient. Furthermore, for a given breakdown voltage, there is a continuous set of drift region thickness and dopant concentrations. Excessively thick drift regions are not desirable because of limitations to on-state resistance reduction, whereas excessively thin layers require very high doping to assure the same breakdown voltage. For a given set of parameters including drift region thickness and substrate doping, increasing the drift region length 29 increases the breakdown voltage up to a constant value determined by the breakdown characteristics at the junction of the drift region 14 and substrate 12. Although a longer drift length 29 facilitates a higher breakdown voltage, the increased separation between the source terminal 26 and the drain terminal 28 also results in higher resistance. A longer drift length 29 adjacent to the end portion 32 of the drain 20 increases the distance that current must travel, thereby significantly contributing to the on-state resistance of the device 10. In some instances, this length 29 may render that portion of the drift region 14 ineffective. Therefore, the length 29 of the drift region 14 should be maintained uniformly between the source 18 and the end portion 32, the transitional portion 36, and the medial portion 38 of the drain 20, in order to maintain an active drift region 14 and a low on-state resistance for the device 10. As a result of decreasing the width of the drain 20 at the transitional 36 and medial portions 38, the drift region 14 and source 18 may be brought closer together, thereby decreasing the width 42 of the device 10 at a central portion thereof. This results in a reduction in the overall area of the device by the area of regions 44 and 46.

Figure 3:
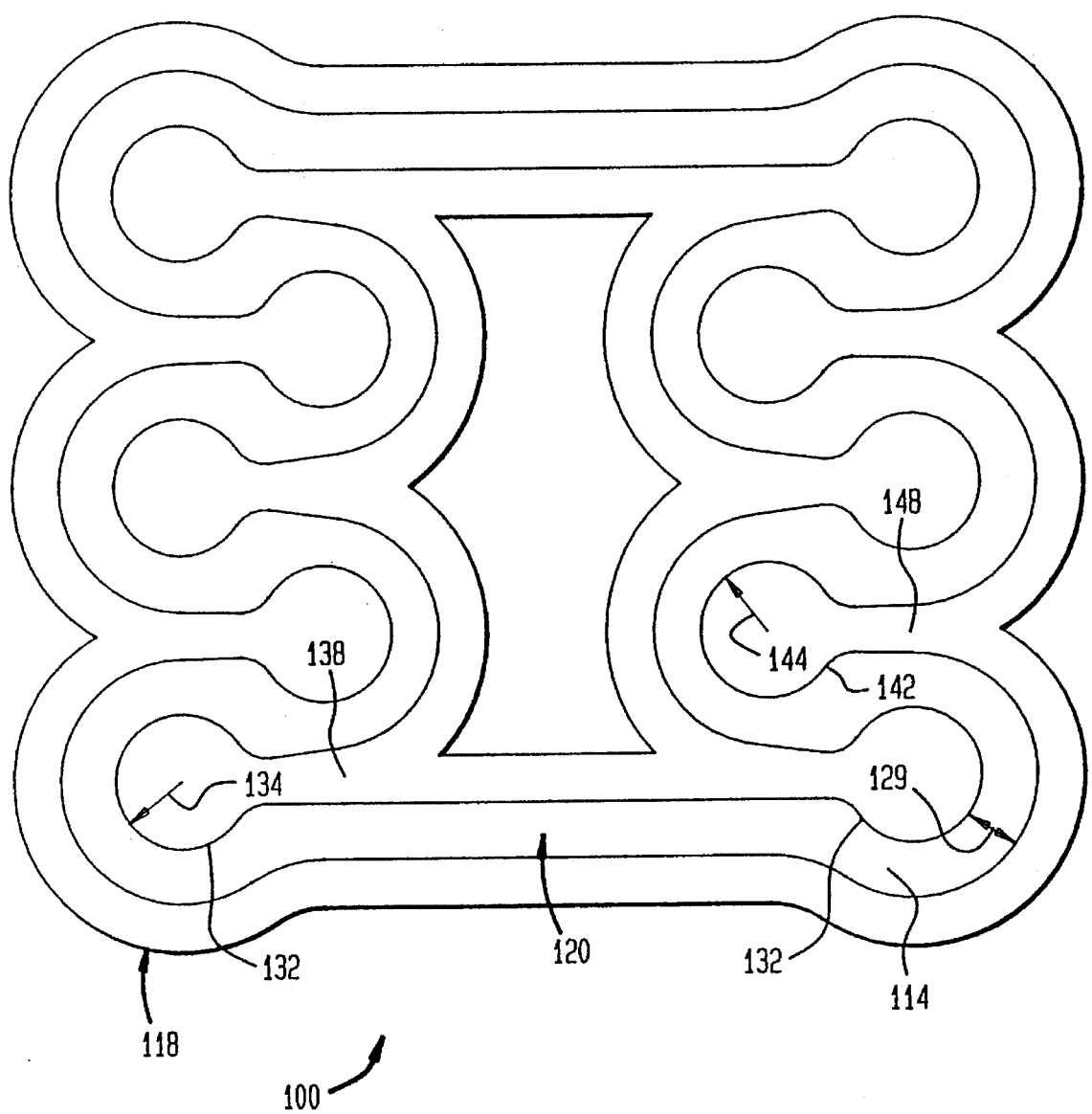
FIG. 3 is a top view of an alternative embodiment of the lateral semiconductor device.

As can be seen in FIG. 3, the features of the layout are also applicable to larger interdigitated devices, such as the alternative embodiment indicated generally at 100. The source 118 and drain 120 regions alternate within the device. The drain 120 would be provided with circular end portions 132 having the minimum radius of curvature 134 suited for the breakdown or voltage rating of the device 100, and narrower medial portion 138 to reduce the overall area of the device. The source 118 would also be fabricated with end portions 142 having the minimum radius of curvature 144 for the breakdown voltage of the device 100, as well as narrower medial portions 148. The drift region 114 between the source 118 and drain 120 has a uniform drift length 129 within the device 100 to maintain the on-state resistance.

Figure 4:
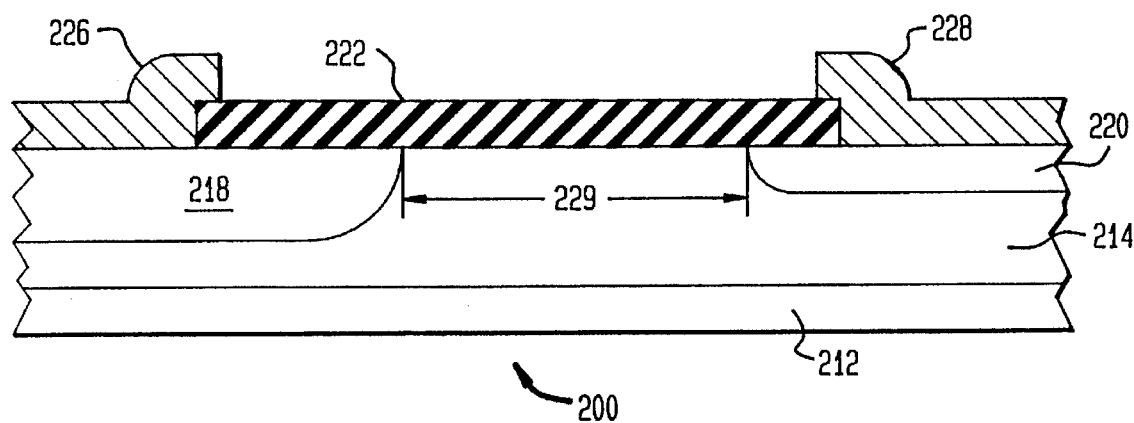
FIG. 4 is a cross-sectional view of a second alternative embodiment of the lateral semiconductor device.
Figure 5:
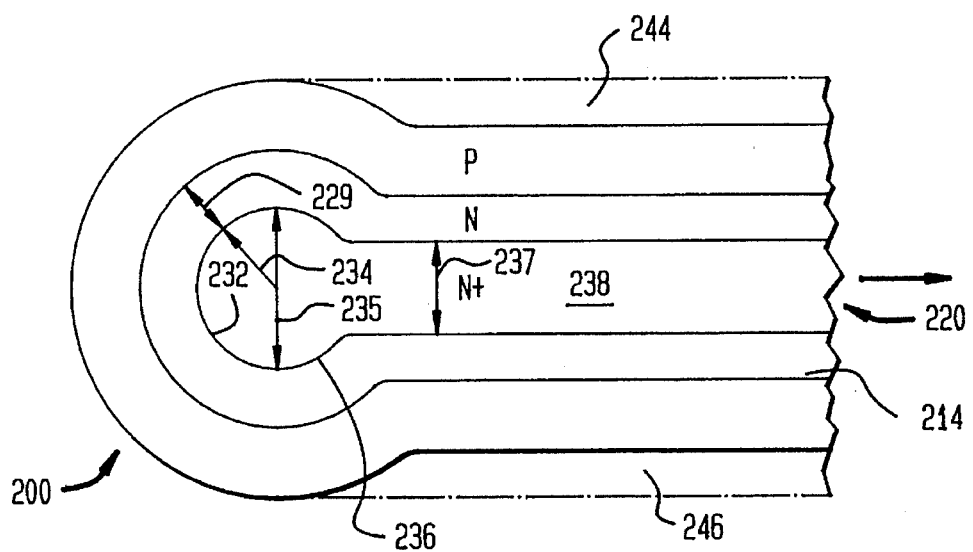
FIG. 5 is a top view of the second alternative embodiment of the lateral semiconductor device.

In an alternative embodiment of the lateral semiconductor is shown generally at 200 in FIGS. 4–5. The device may be fabricated as a simple diode. Referring to FIG. 4, the diode 200 would be formed with a $P^-$ substrate 212 with an $N^-$ drift region 214 applied epitaxially or implanted within the substrate 212. The high voltage anode region 220 may be implanted in the drift region 214, for example, with phosphorus, to create an $N^+$ conductivity type with a higher dopant concentration than the drift region. The cathode region 218 may be implanted with a P-type dopant such as boron. The drift length 229 is established between the cathode 218 and anode 220. An oxide layer 222, as well as anode contact 228 and anode contact 26, are formed on the surface of the diode 200.

FIG. 5 is a top view of the alternative embodiment of the semiconductor device 200. The cathode region 220 is provided with an end portion 232 having a radius of curvature 234 suitable for the breakdown voltage of the device 200. The end portion 232 has a first lateral surface width 235. A transitional portion 236 tapers from the first lateral surface width 235 to a second lateral surface width 237. A medial portion 238 is provided with the second lateral surface width 237. A drift region 214 surrounds the anode 220 and maintain a uniform drift length 229 throughout the device. This configuration results in a reduction of the area of the device by regions 244 and 246. NMOS transistor, IGFET devices and thyristors may also be manufactured using the principles described hereinabove. The conductivity type of the regions within the device may be reversed provided the voltage polarities are appropriately changed in the manner well known in the art.

Although the subject invention has been described with respect to preferred embodiments, it will be readily apparent to those having ordinary skill in the art to which it appertains that changes and modifications may be made thereto without departing from the spirit or scope of the subject invention as defined by the appended claims.

What is claimed is:

1. A lateral semiconductor device comprising:
   a semiconductor body of a first conductivity type;
   a drift region of a second conductivity type opposite to that of the first conductivity type and formed on a surface of the semiconductor body;
   a drain region formed in the drift region and having a surface area including at least two end portions, each having a predetermined surface radius of curvature selected such that the drain region will sustain a predetermined breakdown voltage of the device and a first surface width, a transitional portion which tapers from the first surface width to a second surface width smaller than the first surface width, and a medial portion having the second surface width; and
   a source region formed in the drift region and spaced from the drain region.

2. The lateral semiconductor device of claim 1, wherein the breakdown voltage of the device is more than 300 volts.

3. The lateral semiconductor device of claim 1, wherein the source region is uniformly spaced from the drain region.

4. The lateral semiconductor device of claim 1, wherein the drain region is of the second conductivity type and has a greater dopant concentration than the drift region.

5. The lateral semiconductor device of claim 4, wherein the source region is of the second conductivity type and has a greater dopant concentration than the drift region.

6. The lateral semiconductor device of claim 5, which further comprises a channel body of the first conductivity type and has a greater dopant concentration than the semiconductor body, the channel body substantially surrounding the source region.

7. The lateral semiconductor device of claim 6, wherein the semiconductor body is P-type, the drift region is N-type, the source and drain regions are $N^+$ type, and the channel body is $P_-^+$-type.

8. The lateral semiconductor device of claim 4, wherein the source region is of the first conductivity type and having a greater dopant concentration than the semiconductor body.

9. The lateral semiconductor device of claim 8, wherein the semiconductor body is P-type, the drift region is N-type, the drain region is N type, and the source region is $P_{-+}$-type.

10. The lateral semiconductor device of claim 1, wherein the source region has a surface area including an end portion with a predetermined surface radius of curvature and a first surface width, a transitional portion which tapers from the first surface width to a second surface width, and a medial portion having the second surface width.

11. The lateral semiconductor of claim 10, wherein the source region and the drain region are formed in the drift region with an alternating configuration.

12. A lateral MOS structure comprising:
    a semiconductor body of a first conductivity type;
    a drift region of a second conductivity type formed on a surface of the semiconductor body;
    a drain region of a second conductivity type forming a drain junction within the drift region, the drain region having at least two end portions, each having a predetermined surface radius of curvature selected such that the drain region will sustain a predetermined breakdown voltage of the MOS structure and a first lateral surface width at at least one point, a transitional portion tapering from the first lateral surface width to a second lateral surface width smaller than the first lateral surface width, and a medial portion having the second lateral surface width;
    a source region of a second conductivity type forming a source junction along an outer edge thereof; and
    a channel body of a first conductivity type substantially surrounding the source region.

13. The lateral MOS structure of claim 12, wherein the breakdown voltage of the structure is more than 300 volts.

14. The lateral MOS structure of claim 12, wherein the drain region is uniformly spaced from the source region.

15. The lateral MOS structure of claim 12, wherein the drain and source regions having higher dopant concentration than the drift region, and the channel body having greater dopant concentration than the semiconductor body.

16. The lateral MOS structure of claim 15, wherein the semiconductor body is P-type, the drift region is N-type, the source and drain regions are $N^+$ type, and the channel body is $P_-^+$-type.

17. A diode structure comprising:
    a semiconductor body of a first conductivity type;
    a drift region of a second conductivity type formed on a surface of the semiconductor body;
    an anode region of a second conductivity type forming an anode junction within the drift region, the anode region having at least two end portions, each having a predetermined radius of curvature selected such that the anode will sustain a predetermined breakdown voltage of the diode structure and a first lateral surface width at at least one point, a transitional portion tapering from the first lateral surface width to a second lateral surface width smaller than the first lateral surface width, and a medial portion having the second lateral surface width; and
    a cathode region of the first conductivity type forming a cathode junction within the drift region.

18. The diode structure of claim 17, wherein the breakdown voltage of the structure is more than 300 volts.

19. The diode structure of claim 17, wherein the cathode region is uniformly spaced from the anode region.

* * * * *